United States Patent [19]
Hirakawa

[11] Patent Number: 6,037,814
[45] Date of Patent: Mar. 14, 2000

[54] PLL CIRCUIT OF DISPLAY MONITOR

[75] Inventor: Haruyasu Hirakawa, Kamakura, Japan

[73] Assignee: Matsushita Electric Industrial Co., Ltd., Osaka, Japan

[21] Appl. No.: 08/900,629

[22] Filed: Jul. 25, 1997

[30]        Foreign Application Priority Data

Jul. 25, 1996 [JP] Japan ................................. 8-195887

[51] Int. Cl.[7] ............................................. H03L 7/06
[52] U.S. Cl. ........................ 327/156; 331/1 A; 331/25
[58] Field of Search .................................. 327/156, 159,
327/160; 331/17, 25, 16, 14

[56]            References Cited

U.S. PATENT DOCUMENTS

| | | | |
|---|---|---|---|
| 4,727,591 | 2/1988 | Manlove | 331/16 |
| 4,856,082 | 8/1989 | Kasa | 455/161 |
| 5,068,731 | 11/1991 | Takeuchi | 358/180 |
| 5,202,906 | 4/1993 | Saito et al. | 331/14 |
| 5,371,480 | 12/1994 | Hedberg et al. | 331/16 |

*Primary Examiner*—Timothy P. Callahan
*Assistant Examiner*—An T. Luu
*Attorney, Agent, or Firm*—Ratner & Prestia

[57]            ABSTRACT

In a PLL circuit used in a display monitor, it is made possible to design a PLL circuit using a VCO of excellent frequency stability. In this PLL circuit, low jitter of display monitor is realized without having to consider variations of oscillation frequency of VCO practically. It solves the problems of effects of variations of oscillation frequency on the cost and productivity. This PLL circuit preliminarily detects the range of frequency dividing range of the frequency dividing ratio of the dividing circuit capable of locking the PLL circuit with respect to the input signal with known frequency by frequency detecting means. The detected frequency data is stored in the memory. On the basis of the frequency data, the frequency dividing ratio of the dividing circuit is set. By this setting, even if different input signals are entered, the VCO operates at a frequency near the center of the variable range of the oscillation frequency.

8 Claims, 4 Drawing Sheets

PLL CIRCUIT OF DISPLAY MONITOR

FIELD OF THE INVENTION

The present invention relates to a PLL (phase locked loop) circuit used in a generating circuit of clock signal, a generating circuit of horizontal drive pulse signal, or the like used in a digital circuit in, for example, a display monitor.

BACKGROUND OF THE INVENTION

Recently, in a display monitor, digital circuits are used in circuits for generating deflection correction waveforms for correcting display distortion and others, and a PLL circuit is used in a clock signal generating circuit used in a digital circuit. Conventionally, a horizontal drive pulse was generated in an analog horizontal synchronizing circuit of an exclusive integrated circuit (IC). However, when incorporating various functions of display monitor into a digital IC, generation of horizontal drive pulse is also accommodated in a same IC, and generation of horizontal drive pulse requires to use the PLL circuit for multiplying the clock signal used in the same digital circuit.

An example of such PLL circuit is shown in FIG. 4. In FIG. 4, when the frequency dividing ratio of a dividing circuit 4 is set at a specified value N, and the PLL is in locked state, and output signal of a VCO (voltage controlled oscillator) 3 is synchronized with a reference signal entered in a phase comparator 1, and its oscillation frequency is N times of the frequency of the reference signal. In the PLL circuit, the frequency dividing ratio of the dividing circuit 4 may be sometimes fixed, but it may be also controlled by a CPU 5 depending on the frequency of the entered reference signal as shown in the diagram.

In the PLL circuit, in order to decrease jitter generated in the reproduced image shown in the display monitor due to phase fluctuation or phase noise of the PLL circuit, it is preferred to use an oscillator of an excellent frequency stability in the VCO. When an oscillator of an excellent frequency stability is used in the VCO, the control sensitivity of the oscillation frequency of the VCO is often lowered. Generally, since the voltage width to be controlled is limited, the variable frequency range capable of controlling the oscillation frequency of the VCO is narrow. For example, the resonance type VCO high in frequency stability is narrower in the controllable variable frequency range as compared with the VCO of multi-vibrator type or ring oscillator type.

However, due to variations of constants of the parts being used, the oscillation frequency oscillated by the VCO varies, and the VCO often oscillates at a frequency exceeding an expected frequency range. Therefore, when designing the circuit, it is necessary to determine the stability of oscillation frequency in consideration of variation of constituent parts used in the circuit. By such designing, to the contrary, the stability of oscillation frequency of VCO is lowered and the jitter performance declines.

Accordingly, to suppress variations of oscillation frequency, the circuit designers attempted to limit the VCO composing parts to the parts particularly small in allowable deviation, and adjust individually the oscillation frequency in the production process by using variable capacity capacitors or the like.

As a result, the cost of the appliances using such circuits was raised, and the productivity was impaired.

SUMMARY OF THE INVENTION

A PLL circuit of the invention comprises frequency detecting means for detecting a variable range of oscillation frequency of a VCO, a dividing circuit for dividing the oscillation frequency of the VCO, memory means for storing frequency data of the VCO preliminarily detected by the frequency detecting means, and control means for setting the dividing ratio of the dividing circuit so as to operate the VCO at a frequency near the center of a variable range of oscillation frequency of the VCO on the basis of the frequency data stored in the memory means. By using this PLL circuit, it is possible to suppress jitter phenomenon of image due to fluctuation of phase occurring in the PLL circuit.

DESCRIPTION OF THE PREFERRED EMBODIMENTS

First exemplary embodiment

A first embodiment of the invention is described below by referring to FIG. 1 and FIG. 2.

Figure 1:
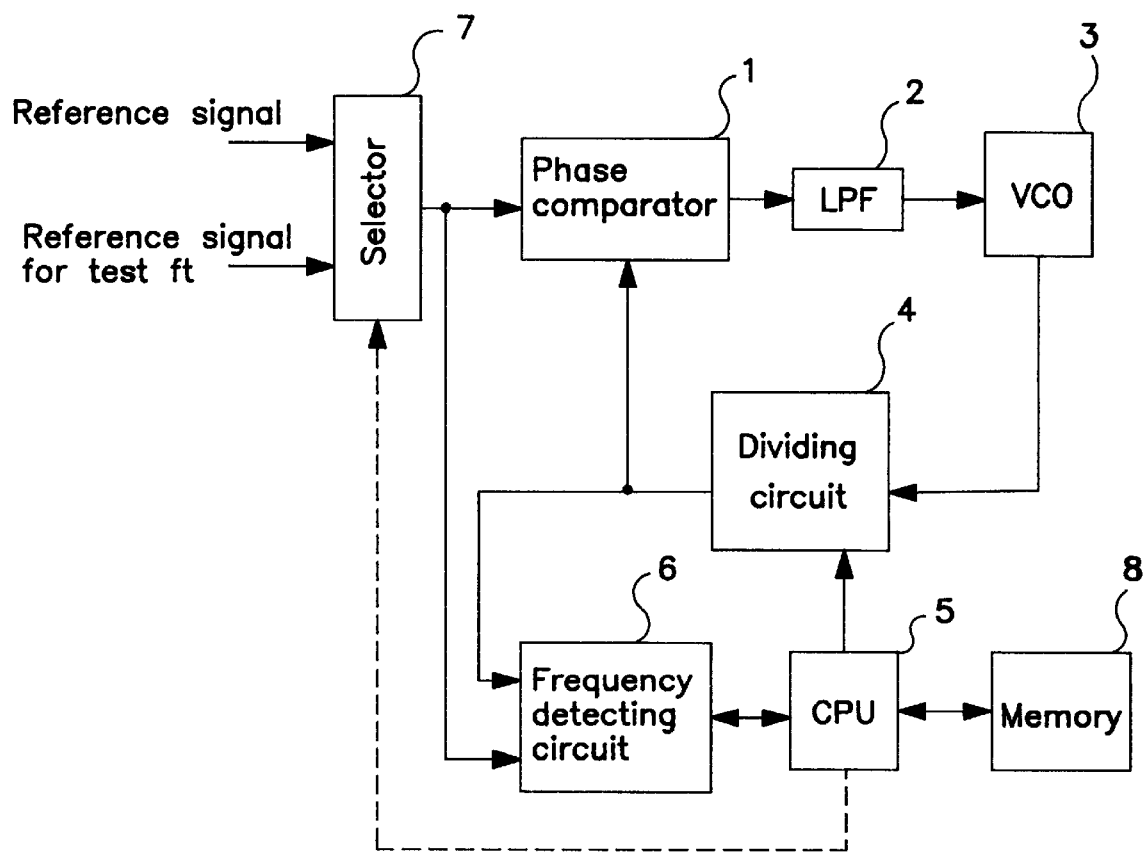
FIG. 1 is a block diagram of a PLL circuit in a first embodiment of the invention.

In FIG. 1, a phase comparator 1, a low pass filter 2, a VCO 3, and a programmable counter (hereinafter called dividing circuit) 4 compose a general PLL circuit. A selector 7 changes over, by control from a CPU 5, between a reference signal for test to be entered when testing or installing a display monitor, and a reference signal of normal operation, and issues to the phase comparator 1. The phase comparator 1 detects the phase difference of the output signal of the selector 7 and the output signal of the dividing circuit 4, and issues the detected output voltage to the low pass filter 2. The detected output voltage filters and attenuates the high frequency components in the low pass filter 2, and is applied to the VCO 3 as a control voltage at a frequency oscillated by the VCO 3.

The dividing circuit 4 receives the output signal of the VCO 3, and divides the oscillation frequency of the VCO 3 by a specific frequency dividing ratio, and enters into the phase comparator 1. The frequency dividing ratio of the dividing circuit is set by the CPU 5.

A frequency detecting circuit 6 detects the frequency of the reference signal and the output signal of the dividing circuit 4. That is, the frequency detecting circuit 6 detects the frequency of the reference signal which is an input signal to the display monitor, and monitors the input signal, and the CPU 5 determines the frequency dividing ratio of the dividing circuit 4 accordingly.

Moreover, the frequency detecting circuit 6 detects the frequency of the reference signal and the output signal of the dividing circuit 4, and sends out the result of detection to the CPU 5, while the CPU 5 confirms the locked state of the PLL.

Figure 2:
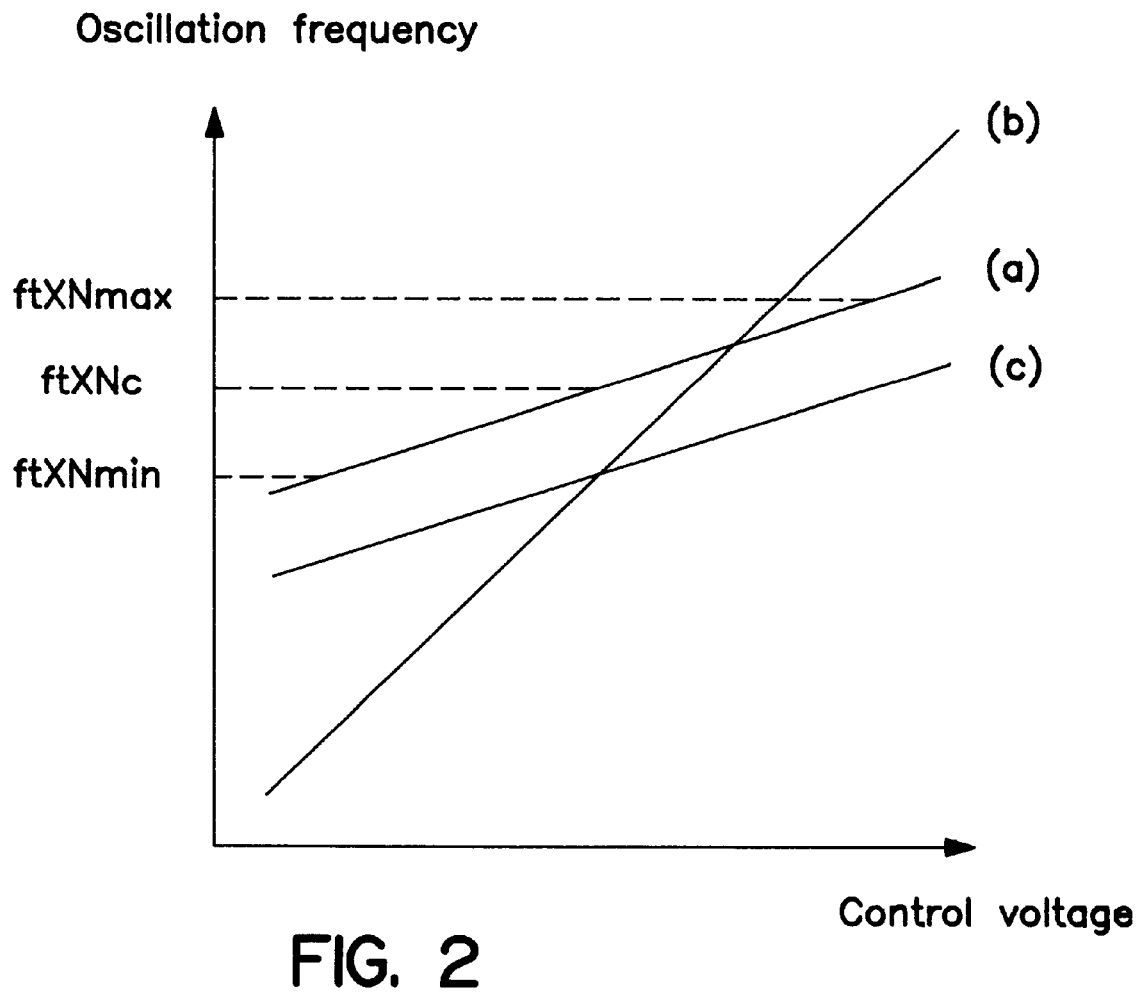
FIG. 2 is a graph shoving the control characteristic of a VCO for explaining the first embodiment of the invention.

FIG. 2 shows an example of frequency control characteristic of the VCO. In FIG. 2, the axis of ordinates denotes the oscillation frequency of VCO. The axis of abscissas represents the control voltage to the VCO, and its input control voltage is a voltage to be applied to the VCO 3 through the phase comparator 1 and low pass filter 2 in order to control the frequency oscillated by the VCO 3.

For example, line (a) shows the oscillation frequency oscillated by a certain VCO accordingly when this VCO receives control of control voltage. The above resonance type VCO shows such characteristic. The left end (lower end) of the line indicates the oscillation minimum frequency fmin of the VCO depending on the minimum voltage Vmin of the control voltage applied to the VCO 3, and the right end (upper end) of the line shows the oscillation maximum frequency fmax of the VCO corresponding to the maximum voltage Vmax of the control voltage applied to the VCO 3.

In FIG. 1, while the selector 7 is selecting the reference signal for test, that is, while the PLL circuit is operating at the reference signal for test at frequency ft, if the set frequency dividing ratio is N, the oscillation frequency of the VCO 3 in the locked state of PLL is ft×N. In the case of PLL locked state, the frequency detecting circuit 6 detects the frequency of the output signal of the dividing circuit 4, but the value of this frequency is nearly same ft as the reference signal.

While the VCO is indicating the control characteristic in FIG. 2 (a) and the input signal is operating by the reference signal for test at frequency ft, the following measurement is carried out in the PLL circuit.

The frequency dividing ratio of the dividing circuit 4 of the PLL circuit is changed sequentially, and the frequency dividing ratio at which the PLL is capable of maintaining the locked state (therefore the frequency of the output signal of the dividing circuit 4 is nearly ft) is measured. It is understood that the oscillation frequency range of the VCO 3 corresponding to the frequency dividing ratio from the lower limit value Nmin of the measured frequency dividing ratio to the upper limit value Nmax is from Nmin×ft to Nmax×ft. In the operation by the reference signal for test, when the frequency dividing ratio of the dividing circuit is selected in the median value of the lower limit value Nmin and upper limit value Nmax, the operation of the PLL circuit takes place nearly in the middle of the control range of the VCO.

In normal operation, considering the frequency ratio of the frequency of reference signal for test and the frequency of reference signal in normal operation, when the frequency dividing ratio is set according to this frequency ratio, the operation of the PLL circuit takes place nearly in the middle of the control range of the VCO.

Thus obtained data and the data obtained by calculating them are stored in the memory 8 as the measured VCO frequency data.

In normal operation from the next time, the VCO frequency data stored in the memory 8 is utilized, and the frequency dividing ratio of the dividing circuit is determined according to the reference signal to be entered.

In this way, corresponding to reference signals of various frequencies, the oscillation frequency of the VCO 3 can be set nearly in the middle of the control range for operation of PLL.

As the VCO frequency data, calculating the lower limit value Nmin and upper limit value Nmax of the frequency dividing ratio in the following formula, Nc may be stored in the memory 8.

$$Nc=(Nmin+Nmax)/2$$

Incidentally, if the right side is a fraction, an integer counting up or discarding the fraction is used as the Nc.

In next normal operation, the frequency dividing ratio N to be set in the dividing circuit is the value calculated in the following formula from the frequency data Nc of the VCO 3 being read out from the memory 8, in terms of the frequency detection result fH of the entered frequency signal.

$$N=Nc \times ft/fH$$

The difference between Nc and, for example, design standard value Ntyp, $\Delta N(=Nc-Ntyp)$ may be also stored in the memory 8. In next normal operation, the frequency dividing ratio N to be set in the dividing circuit is the value calculated in the following formula from the frequency data $\Delta N$ of the VCO 3 being read out from the memory 8, in terms of the frequency detection result fH of the entered frequency signal.

$$N=Ntyp \times ft/fH + \Delta N \times ft/fH$$

In FIG. 2, when the frequency dividing ratio of the dividing circuit is fixed and it is necessary to oscillate at a specified frequency, considering the variation of the oscillation frequency of the VCO, the VCO showing the control characteristic as shown in (b) is required. The VCO showing such control characteristic is poor in frequency stability, and is likely to be influenced by the control voltage.

Such VCO changes the oscillation frequency depending on the change of the control voltage due to a slight fluctuation of phase, and significantly deteriorates the jitter characteristic. On the other hand, the VCO showing the control characteristic as shown in (a) is excellent in frequency characteristic, and is hence hardly influenced by control voltage.

Such VCO is small in change of oscillation frequency corresponding to the change of the control voltage due to fluctuation of phase and is hence excellent in jitter characteristic.

Incidentally, when the design target is the characteristic of (c) but the characteristic is actually (a) due to variation of oscillation frequency, by setting the frequency dividing ratio of the dividing circuit in every VCO, it is possible to operate the PLL circuit in the middle of the control range.

Therefore, it is not necessary to match with the characteristic of (c) by adjusting the oscillation frequency individually in every VCO, and the limitation of the allowable error of characteristic value of the parts used in the VCO may be largely alleviated.

Of course, it is necessary to measure the oscillation frequency of the VCO only once on a certain moment or occasion. Detection of oscillation frequency range of the VCO may be done alone if possible, but when checking the locking range of the PLL, it is not necessary to apply certain voltage to the VCO from outside, but it is convenient to process by the software alone.

Second exemplary embodiment

Figure 3:
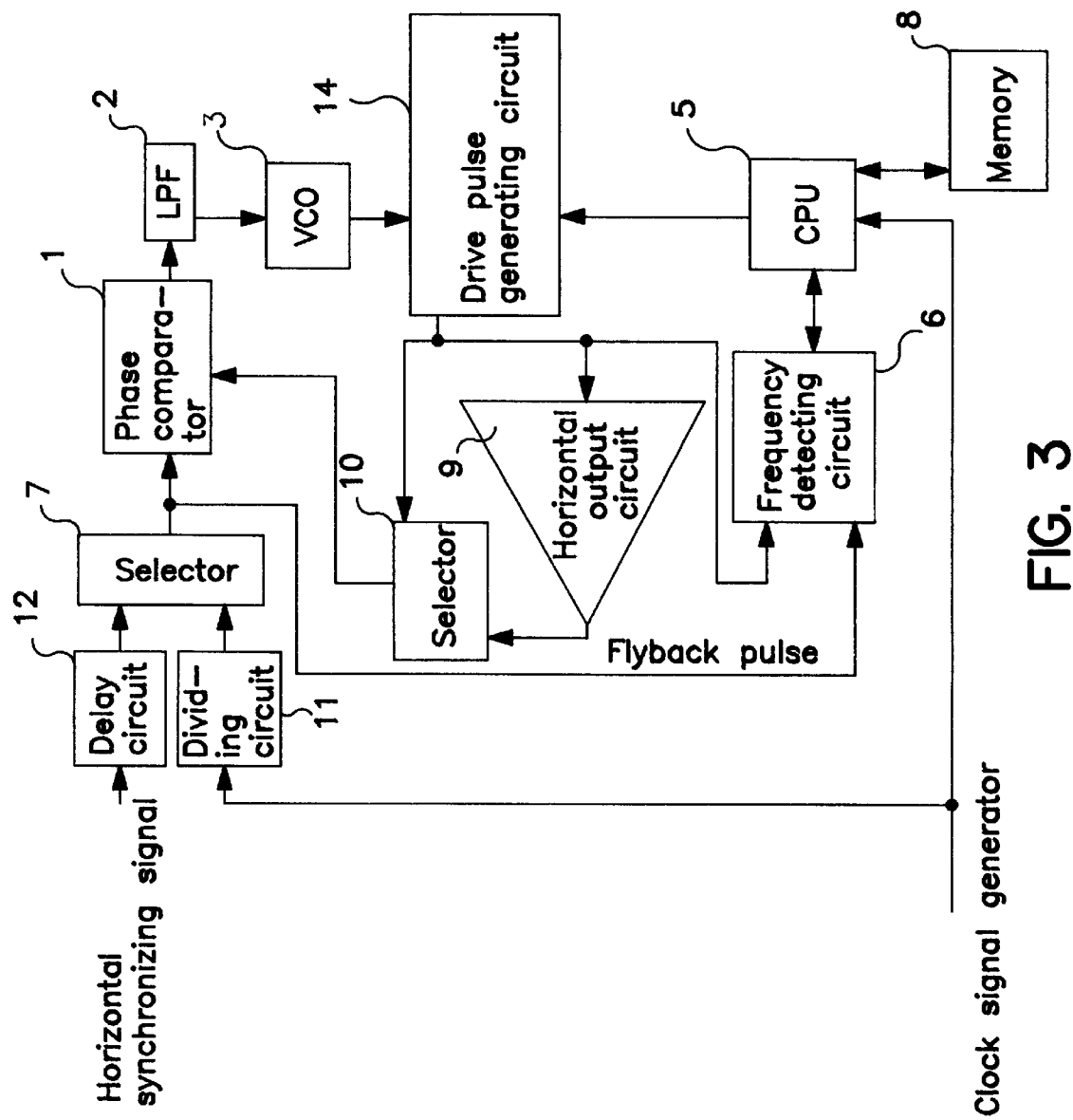
FIG. 3 is a block diagram showing a horizontal drive pulse generating circuit of a display monitor in a second embodiment of the invention.
Figure 4:
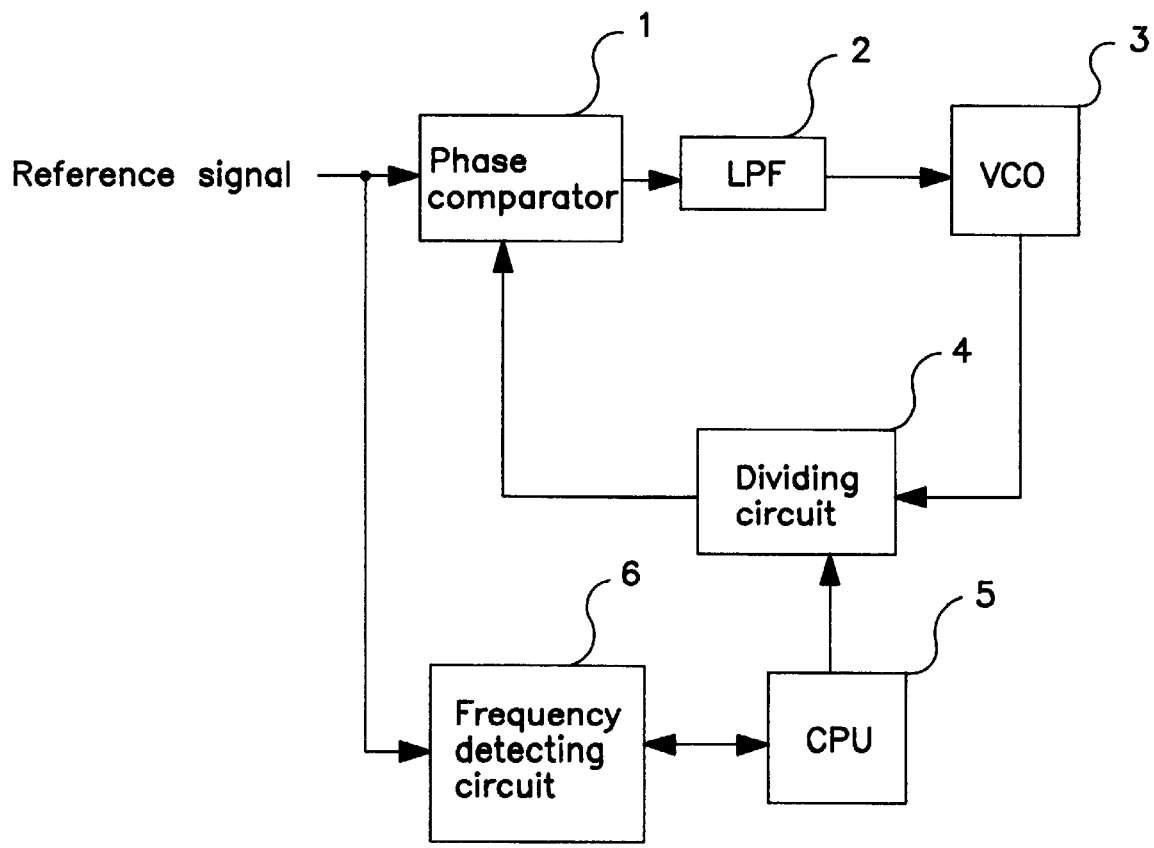
FIG. 4 is a block diagram of a conventional PLL circuit.

A second embodiment of the invention is described by reference to FIG. 3. In FIG. 3, a horizontal drive pulse generating circuit of display monitor is used as the PLL circuit of the invention.

In FIG. 3, a selector 7 changes over, by the control of a CPU 5, between a reference signal for test, and a reference signal to be entered through a delay circuit 12 from a horizontal synchronizing signal, and issues to a phase comparator 1.

The reference signal for test is an input signal used in test or production process of display monitor, and it is mainly generated by dividing a clock signal issued by a clock signal generator composed of a quartz oscillation circuit for generating operation clock of CPU in a dividing circuit 11. A general PLL circuit is composed of phase comparator 1, low pass filter 2, VCO 3, and drive pulse generating circuit 14, or of drive pulse generating circuit 14 and horizontal output circuit 9.

The phase comparator 1 detects the phase difference of the output signal of the selector 7 and the output signal of the drive pulse generating circuit 14 operating as dividing circuit, and issues the detected output voltage to the low pass filter 2.

The detected output voltage filters and attenuates the high frequency range in the low pass filter 2, and is applied to the VCO 3 as the control voltage at the frequency oscillated by the VCO 3.

The drive pulse generating circuit 14 operating as dividing circuit receives the output signal of the VCO 3, divides the oscillation frequency of the VCO 3 at a specified frequency dividing ratio, and issues to the phase comparator 1. The frequency dividing ratio of the dividing circuit is set by the CPU 5.

The drive pulse generating circuit 14 operating as dividing circuit divides the output signal of the VCO 3, and issues the divided output signal to a selector 10, and the output signal of the drive pulse generating circuit 14 functions as the horizontal drive pulse for driving the horizontal output circuit 9.

A frequency detecting circuit 6 detects the frequency of the reference signal and the output signal of the dividing circuit contained in the drive pulse generating circuit 14. That is, the frequency detecting circuit 6 detects the frequency of the reference signal which is an input signal to the display monitor, and monitors the input signal, while the CPU can determine the frequency dividing ratio of the dividing circuit accordingly.

Moreover, the frequency dividing circuit 6 detects the frequency of the reference signal and the output signal of the drive pulse generating circuit 14, sends out the result of detection to the CPU 5, while the CPU 5 checks the locked state of the PLL.

The selector 10 selects either the divided output signal or the flyback pulse. The divided output signal is a signal of dividing the output signal of the VCO 3 in the drive pulse generating circuit 14 operating as the dividing circuit. The flyback pulse is one of the output signals of the horizontal output circuit 9, and the output signal of the drive pulse generating circuit 14 is one of the signals driving the horizontal output circuit 9 and issued by the horizontal output circuit 9.

The selector 10 selects the output signal being divided when measuring the oscillation frequency of the VCO, and selects the flyback pulse in normal operation.

By the PLL circuit of this circuit, if the circuit delay of the horizontal output circuit 9 is changed due to effect of temperature or the like, the phase of the flyback pulse can be kept constant, and the horizontal screen position can be always fixed at the phase determined by the delay circuit 12.

In this embodiment, the reference signal for test is obtained by dividing the clock for operating the CPU in the dividing circuit 11, so that external input of reference signal for test is not necessary. As clear from the explanation herein, on the basis of the input from the frequency dividing circuit 6, by the control of selector 7, selector 10, and drive pulse generating circuit or dividing circuit, and calculation and setting of preferred frequency dividing ratio, and the like, absorption of variations of oscillation frequency of VCO can be completely done automatically by the software of the CPU.

Thus, according to the invention, if the oscillation frequency of the VCO varies, it is possible to operate at the optimum frequency depending on the oscillation frequency of each VCO, and the design for using the VCO of stable frequency can be realized, and therefore, while keeping low jitter, it presents a PLL circuit minimizing the effects of variation of oscillation frequency of the VCO on the cost and productivity.

What is claimed is:

1. A PLL circuit comprising:
   frequency detecting means for detecting a variable range of an oscillation frequency of a VCO voltage controlled oscillator ("VCO"),
   a dividing circuit for dividing the oscillation frequency of said VCO,
   memory means for storing frequency data of said VCO preliminarily detected by said frequency detecting means, and
   control means for setting the dividing ratio of said dividing circuit so as to operate said VCO at a frequency near the center of a variable range of oscillation frequency of said VCO on the basis of the frequency data stored in said memory means, wherein the control means is a CPU, the dividing circuit is controlled by the dividing ratio set by said CPU, the frequency detecting means uses a reference signal for test, the frequency of an output signal of the dividing circuit is detected while sequentially changing the dividing ratio of the dividing circuit by said CPU, the CPU judges a locked state of the PLL circuit at the dividing ratio on the basis of the detection, said CPU calculates a range of the dividing ratio that is lockable by the PLL circuit with respect to the reference signal, and the memory means stores the result of calculation.

2. A PLL circuit of claim 1, wherein the frequency data of the VCO stored in the memory means is data corresponding to the center frequency in the variable range of the oscillation frequency of the VCO.

3. A PLL circuit of claim 1, wherein the memory means stores the center value Nc of the frequency dividing ratio of the dividing circuit that can be locked by the PLL circuit with respect to the reference signal for test at frequency ft as frequency data of the VCO, and the CPU sets the frequency dividing ratio of the dividing circuit at N, by calculating in the formula where the frequency dividing ratio N is N≈Nc× ft/fH, using Nc and fH stored in the memory means when the reference signal of which frequency is fH is entered.

4. A PLL circuit of claim 1, wherein the memory means stores the difference ΔN of the central value Nc of the frequency dividing ratio that can be locked by the PLL circuit with respect to the reference signal for test at frequency of ft and standard value Ntyp, and the CPU sets the frequency dividing ratio of the dividing circuit to N, by calculating in the formula where the frequency dividing ratio N is N=Ntyp×ft/fH+ΔN×ft/fH, when the reference signal of which frequency is fH is entered.

5. A PLL circuit of claim 1, further comprising:
   a drive pulse generating circuit operating as dividing circuit,
   a horizontal output circuit driven by an output signal of said drive pulse generating circuit, and
   a selector for selecting either the output signal of said drive pulse generating circuit or the output signal of said horizontal output circuit, of which output signal selects the PLL,
   wherein the output signal of said drive pulse generating circuit is selected when testing, and the output signal of said horizontal output circuit is used in normal operation.

6. A PLL circuit of claim 1, wherein a clock signal is used as the reference signal for test.

7. A setting method of frequency dividing ratio of a PLL circuit comprising:

a step of detecting frequency ft of reference signal for test, a step of sequentially changing the frequency dividing ratio with respect to said reference signal for test, a step of detecting the frequency of output signal of said dividing circuit by said frequency detecting means at each frequency dividing ratio, a step of confirming that the PLL is in locked state by comparing the frequency of the reference signal for test and the frequency of output signal of the dividing circuit, a step of determining and storing the maximum value and minimum value of the frequency dividing ratio for the PLL to maintain the locked state, a step of calculating and storing the central value Nc of the frequency dividing ratio from the maximum value and minimum value of said frequency dividing ratio, a step of detecting frequency fH of reference signal to be entered in normal operation, a step of calculating the frequency dividing ratio from the central value Nc of the frequency dividing ratio of the frequency fH of the reference signal to be entered and the frequency ft of the reference signal for test in the formula $$N=Nc*ft/fH, \text{ and}$$

a step of setting the frequency dividing ratio of the dividing circuit at frequency dividing ratio N.

8. A setting method of frequency dividing ratio of a PLL circuit comprising:

a step of detecting frequency ft of reference signal for test, a step of sequentially changing the frequency dividing ratio with respect to said reference signal for test, a step of detecting the frequency of output signal of said dividing circuit by said frequency detecting means at each frequency dividing ratio, a step of confirming that the PLL is in locked state by comparing the frequency of the reference signal for test and the frequency of output signal of the dividing circuit, a step of determining and storing the maximum value and minimum value of the frequency dividing ratio for the PLL to maintain the locked state, a step of storing the difference $\Delta N$ from the preliminarily stored standard value Ntyp, by calculating the central value Nc of the frequency dividing ratio from the maximum value and minimum value of said frequency dividing ratio, a step of detecting frequency fH of reference signal to be entered in normal operation, a step of calculating the frequency dividing ratio from the central value Nc of the frequency dividing ratio of the frequency fH of the reference signal to be entered and the frequency ft of the reference signal for test in the formula $$N=Ntyp \times ft/fH + \Delta N \times ft/fH, \text{ and}$$

a step of setting the frequency dividing ratio of the dividing circuit at frequency dividing ratio N.

* * * * *

UNITED STATES PATENT AND TRADEMARK OFFICE
CERTIFICATE OF CORRECTION

| | | |
|---|---|---|
| PATENT NO. | : 6,037,814 | Page 1 of 1 |
| DATED | : March 14, 2000 | |
| INVENTOR(S) | : Hirakawa | |

It is certified that error appears in the above-identified patent and that said Letters Patent is hereby corrected as shown below:

<u>Title page,</u>
Item [56], References Cited, add the following:

-- U.S. PATENT DOCUMENTS

| | | |
|---|---|---|
| 5,257,294 | 10/1993 | Pinto et al. |
| 5,281,926 | 1/1994 | Rabii |

FOREIGN PATENT DOCUMENTS

| | | |
|---|---|---|
| 08116470 | 5/1996 | Japan |

OTHER PUBLICATIONS
European Search Report dated 07/02/99, application no. 97112586.9-1233. --

<u>Column 6,</u>
Line 43, "$N \approx Ncx$" should read -- $N = NcX$ --.

Signed and Sealed this

Twenty-fifth Day of December, 2001

*Attest:*

*Attesting Officer*

JAMES E. ROGAN
*Director of the United States Patent and Trademark Office*